United States Patent [19]
Nae et al.

[11] Patent Number: 6,069,217
[45] Date of Patent: *May 30, 2000

[54] URETHANE-ACRYLIC COPOLYMER THICKENING COMPOSITIONS FOR AQUEOUS SYSTEMS

[75] Inventors: Hemi N. Nae; Alice C. Eng, both of Princeton Jct., N.J.

[73] Assignee: Rheox, Inc., Highstown, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/813,192

[22] Filed: Mar. 7, 1997

[51] Int. Cl.⁷ .................................................. C08F 226/00
[52] U.S. Cl. ........................................ 526/301; 524/555
[58] Field of Search ............................................... 526/301

[56] References Cited

U.S. PATENT DOCUMENTS

| | | | |
|---|---|---|---|
| 4,730,021 | 3/1988 | Zomm | 524/457 |
| 4,732,808 | 3/1988 | Krampe | 428/355 |
| 5,023,309 | 6/1991 | Kruse | 528/49 |
| 5,691,425 | 11/1997 | Klein | 525/455 |

*Primary Examiner*—Christopher Henderson
*Attorney, Agent, or Firm*—Michael J. Cronin

[57] ABSTRACT

Thickening composition are produced by linking a polyurethane comprising polyisocyanates, polyether polyols, modifying agents and capping agents with an alkali swellable copolymer comprising ethylenically unsaturated carboxylic acid monomers and nonionic vinyl monomers through a connecting monomer having a polymerizable double bond and a hydrogen active group. The thickening composition are used to provide improved viscosity control, flow and leveling to aqueous systems such as paints and coatings, inks, drilling fluids, adhesives, construction materials, personal care and housedhold products.

5 Claims, No Drawings

URETHANE-ACRYLIC COPOLYMER THICKENING COMPOSITIONS FOR AQUEOUS SYSTEMS

BACKGROUND OF THE INVENTION

1. Brief Description of the Invention

The present invention relates to improved thickening compositions, often referred to as rheological additives, used to provide viscosity control, flow, leveling and other Theological properties to aqueous systems such as paints and coatings, inks, drilling fluids, adhesives, construction materials and household products. The invention also includes a method of making such improved thickening compositions, aqueous systems containing such thickening compositions and a method of thickening such aqueous systems.

The invention hereof involves the synthesis of a new family of rheological additives by combining, through a reaction process, chemicals used to make polyurethane polymer compositions with chemicals used to make alkali-swellable copolymer compositions into the same copolymer molecule to provide good flow and leveling and gloss retention that polyurethane associative thickeners impart to water-based systems, together with the good sag resistance that alkali swellable copolymers impart to such water-based systems.

2. Description of the Prior Art

In General

It has long been known that rheological additives, which are added at only a small weight percent to an aqueous system, are needed in order to modify the rheology of aqueous systems such as paints, decorative and protective coatings, paper coatings, household detergents, cosmetics and personal care items, adhesives and sealants, inks, drilling fluids, and the like to improve their application properties.

Thixotropes are rheological additives which impart a three dimensional structure to liquid systems as expressed by high viscosity at low shear rates. When the system is sheared at high shear rates, this structure is broken down, resulting in a decrease in viscosity. The structure recovers when the external force is removed. The rate of recovery determines the application properties of the system such as sag resistance and leveling. Rheological additives are added at about 0.01% to about 10% based on the total weight of the system to be thickened. Often the terms thixotrope and Theological additive are used interchangeably.

Many Theological additives for water based systems are available: natural, modified—natural and synthetic. Natural rheological additives include guar gum, pectin, casein, carrageanan, xanthan gum and alginates. Modified additives include—modified celluloses, most particularly methyl cellulose, hydroxyethyl cellulose, hydroxypropyl cellulose, and carboxymethyl cellulose.

Modified-natural thickeners, such as hydroxyethyl cellulose, have dominated portions of the latex paint thickener market almost since the introduction of latex paint on a commercial scale. Hydroxyethyl cellulose suffers from several disadvantages, not the least of which is its relatively high cost. In some formulations, hydroxyethyl cellulose is responsible for poor spatter resistance and poor leveling. Hydroxyethyl cellulose thickeners as partially natural products are also particularly subject to bacterial and enzymatic-induced degradation, resulting in loss of viscosity and other flow properties, and therefore require the incorporation of anti-biodegradation preservatives when used in aqueous systems. In addition, these types of thickeners swell rapidly in water to form lumps which are not readily dispersed. The proper addition of hydroxyethyl cellulose thickeners, therefore, often requires slow metered addition, resulting in much longer mixing and dilution times than desired.

For these reasons, a search has long continued for other types of thickeners to replace hydroxyethyl cellulose and similar cellulosic thickeners which (1) can be employed as a post-additive directly to aqueous compositions, particularly latex paint and ink compositions, (2) are not biodegradable, (3) yield a lower overall manufacturing cost for equivalent performance with respect to the Theological properties of latex compositions into which the thickeners are mixed, (4) provide better viscosity—control properties, and (5) improve storage stability and pigment suspension.

In the last twenty years, synthetic rheological additives have assumed increased commercial importance. These newer synthetic thickeners provide improved pigment suspension and improved application properties. In water based systems including latex paints, it is highly desired that such systems be flowable during their application, but that they not sag after they have been applied. It is further desired that the coating will form a homogeneous film and a smooth flat surface. Such rheological additives may be added to the aqueous latex system at any time including during the grinding stage or after the pigment has been dispersed, i.e., as a post-additive.

Various synthetic polymeric thickeners have been prepared, for example, polyether-polyurethane associative rheological additives and alkali swellable thickeners.

Two patents issued to Rheox Inc., the assignee herein, describe a family of polyether polyurethane thickening compositions. These patents, U.S. Pat. Nos. 4,499,233 and 5,023,309, describe these rheological additives as the reaction product of polyisocyanates, polyether polyols, modifying agents which contain at least one pendant internal hydrophobic group and at least two active hydrogen moieties terminated by a chemical capping agent.

Another type of polyurethane synthetic thickener used extensively in commercial applications is described in U.S. Pat. Nos. 4,079,028 and 4,155,892. The thickener is described as prepared by reacting at least one water soluble polyether polyol with at least one monofunctional hydrophobic organic compound, usually an organic monoisocyanate. A related type of synthetic polyurethane thickener is a water-soluble thermoplastic organic polymer having a number of monovalent hydrophobic groups incorporated in the internal portion of the polymer molecule. U.S. Pat. Nos. 4,496,708 and 4,426,485, issued to Union Carbide Corporation, describe polyurethane thickeners which are water-soluble comb polymers containing a number of pendant internal hydrophobic groups.

The above-described rheological additives, have been often generally referred to by the term polyurethane associative thickeners. Associative thickeners are so-called because the mechanism by which they thicken involves hydrophobic associations between the hydrophobic species in the thickener molecules and other hydrophobic surfaces, either on other thickener molecules or on latex particles, pigments or micelles in the system to be thickened.

Alkali swellable thickeners are manufactured by copolymerizing two or more monomers, one or more of which is carboxyl-containing. These polymers may have an essentially linear structure, a branched structure or a three dimensional network structure caused by cross-linking. One of the first such polymers is described in Rheox U.S. Pat. No. 4,226,754, issued in 1980, which in a preferred embodiment discloses a polymer made by the reaction of (a) an ester of methacrylic acid, (b) methacrylic acid and (c) a vinyl ester of a saturated aliphatic carboxylic acid. This type of thickener has often been referred to as an alkali-swellable or alkali soluble latex copolymeric thickener as it contains carboxylic acid groups in sufficient quantity to render the polymer soluble in water following neutralization with a water-soluble base.

The composition of alkali swellable thickeners has been extended by the introduction of hydrophobic entities into the polymeric backbone. U.S. Pat. No. 4,384,096 describes an improved water soluble thickener which discloses a polymer which is the reaction product of a $C_3$–$C_8\alpha$, $\beta$-ethylenically unsaturated carboxylic acid monomer, a nonionic vinyl monomer, and from 1% to 30% of a defined vinyl surfactant ester. One of the two vinyl surfactant esters shown in the patent is an alkylphenoxypoly (ethyleneoxy) ethyl acrylate, terminated on one end with a $C_8$–$C_{16}$ alkyl phenyl group. U.S. Pat. No. 4,138,381 shows a reaction product of an unsaturated carboxylic acid of 3 to 6 carbon atoms, alkyl acrylate or alkyl methacrylate, and an ester containing an alkyl phenyl group, where the alkyl group has from 8 to 20 carbon atoms.

European Pat. No. 13,836 describes an acrylic emulsion copolymer useful as a thickener, made by the emulsion copolymerization of four types of monomers, which would include a) acrylic or methacrylic acid, b) alkyl acrylate or methacrylate, c) an ethoxylated ester of acrylic or methacrylic acid having a hydrophobic group and d) an optional polyethylenically unsaturated monomer. A 1987 article in Volume 57 of the *Proceedings of the ACS Division of Polymeric Materials* on pages 476 to 481 describes adding by solvation an alkyl polyethylenoxy ether surfactant to a polymer with a polyacrylamide backbone.

A similar variant of a polymeric thickener for aqueous paint and drilling muds is described in U.S. Pat. No. 4,421,902. This patent discloses a copolymer which can be the reaction product of monomers including methacrylic acid, ethyl acrylate, optionally a defined copolymerizable ethylenically unsaturated monomer, and a small weight percent of a polyethylenically unsaturated monomer. This patent further describes how a wide range of surfactants can provide enhancement of thickening when added to an aqueous system containing the copolymer of the invention, when the emulsion copolymer is neutralized.

More recently, U.S. Pat. No. 4,668,410 shows a water-soluble copolymer for systems free of mineral oil, used to adjust the viscosity of the system. This polymer is the reaction product of six components, including methacrylic acid, methacrylic acid esters or acrylic acid esters of certain alcohols, vinyl esters and a surface-active unsaturated ester. The surface-active ester is terminated at one end with an aliphatic ($C_2$–$C_{30}$) -radical, which can be linear or branched, a mono-, di- or tri-alkyl phenyl radical with alkyl groups of 4 to 12 carbon atoms, or a block-copolymeric radical of a specific type. On partial or complete neutralization, the polymer becomes water-soluble or colloidally dispersible in water, and can be used as a thickener.

Urethane-Acrylic Chemistry

Urethane-acrylics are known in the paint and adhesive industries. They have been mostly used as resins or binders. A major application as resins have been low viscosity resins which are cured by chemical reaction or by ultra violet (UV) light to form a crosslinked copolymer. Such compositions are disclosed, for example in European Pat. No. 0511827 and in the Journal of Applied Polymer Science 46 (8) 1339 (1992). Other related compositions are vinyl ester urethane resins (U.S. Pat. No. 3,876,726) and vinyl urethane resins (U.S. Pat. No. 3,929,929). These patents both employ a hydroxy terminated ester of acrylic or methacrylic acid for the purpose of synthesizing a low viscosity resin. U.S. Pat. No. 4,659,780 and U.S. Pat. No. 5,314,942 describe acrylourethane compositions prepared from an acrylic prepolymer, hydroxyethyl acrylate (HEA), hydroxyethyl methacrylate (HEMA), hydroxypropyl acrylate (HPA) or hydroxypropyl methacrylate (BPMA), acrylic or styrenic monomers, a diol, a diisocyanate and a monofunctional alcohol. The latter patent describes a composition which contains reactive groups, reacted with a crosslinking resin such as melamine formaldehyde to form a coating film. U.S. Pat. No. 5,475,038 describes a print laminating adhesive composition comprising an acrylate terminated oligomer of a defined formula derived from the residue of a diisocyanate. U.S. Pat. No. 5,565,508 shows a synthetic resin dispersion prepared using a blocked polyisocyanate and a ethylenically unsaturated monomer. See also recent U.S. Pat. Nos. 5,525,693, 5,480,943 and 5,475,073.

The use of a monoisocyanate with ethylenic unsaturation, such as isocyanatoethyl methacrylate to form a surfactant monomer in an alkali swellable polymer is disclosed in U.S. Pat. No. 5,066,710. A similar approach is disclosed in U.S. Pat. Nos. 4,514,552, 4,722,962, and 4,801,671, describing an alkali soluble thickener prepared from ethylenically unsaturated carboxylic acid, typically methacrylic acid, a monoethylenically unsaturated monomer, typically ethyl acrylate, a nonionic urethane monomer which is the reaction product of a monohydric nonionic surfactant with a monoethylenically unsaturated monoisocyanate and a polyethylenically unsaturated monomer. The last two patents are apparently the basis of the commercial product line known as "Polyphobes" sold by Union Carbide Corporation. The properties of these Polyphobe thickeners are summarized in The American Paint & Coatings Journal, Jul. 3, 1995, p. 51. U.S. Pat. No. 4,730,021 describes a process for preparing aqueous dispersions of urethane acrylate graft copolymers prepared by first reacting an active hydrogen containing vinyl compound with a diisocyanate to produce a monoacrylated diisocyanate adduct useful as binders for coatings and printing inks.

U.S. Pat. No. 4,659,780 shows an ungelled reaction product of an acrylic prepolymer, a diol and a diisocyanate reacted in the presence of a monoalcohol said to be useful in high solids coating compositions. Recent U.S. Pat. No. 5,484,864 describes adhesive compositions with improved bonding formed as the reaction product of a urethane methacrylate and other reactants. Even more recent U.S. Pat. No. 5,594,065 shows a two component coating system based upon crosslinkable hydroxy-containing polymers and a polyisocyanate cross linker.

These products, while effective as the binder in many systems, have not satisfied the need for effective water based thickeners. For these reasons, a search for a polymeric acrylic-urethane thickener has continued. The present invention was developed in response to this search, and the long-felt need it represents for a product which will impart the required sag resistance, viscosity efficiency and good leveling to aqueous systems.

Object of the Invention It is a specific object of the claimed invention to provide a highly effective urethane-acrylic rheological additive for aqueous compositions, particularly aqueous paints and coatings. Such compositions specifically include latex systems, paints, coatings, inks, adhesives, construction materials, household and personal care systems and drilling fluids.

It is a further object of the invention to provide an additive which can easily be made using available chemical materials and current process technology, including known suspension, emulsion and solution polymerization techniques, on a continuous, semi-continuous, or batch basis.

It is a further object of the invention to provide an additive that can be readily dispersed into the system to be thickened, which is easily handled, and which can readily be incorporated.

Other objects, as well as advantages, of the invention will become clear from the following summary and description, or will become apparent to the skilled artisan, as obvious variations of the instant invention.

SUMMARY OF THE INVENTION

The urethane-acrylic thickening compositions of the instant invention are produced as reaction products synthesized in two steps:

1) first by producing a prepolymer comprised of the reaction product of:
    a) one or more polyisocyanates;
    b) one or more polyether polyols;
    c) optionally, one or more modifying agents having at least two moieties reactive with component a) or b) and at least one hydrophobic group,
    d) one or more mono-functional active linear or branched aliphatic, cycloaliphatic or aromatic compounds containing a single active functional group, referred to as capping agents and
    e) a connecting link, which also acts as a capping agent, which can be any monomer or monomers having a polymerizable double bond and a functional group capable of reacting with component a) or b), and 2) when the prepolymer is formed, reacting the prepolymer with the following components:
    f) one or more $C_3$–$C_8$ $\alpha$, $\beta$-ethylenically unsaturated carboxylic acid monomers;
    g) one or more copolymerizable nonionic vinyl monomers, and optionally,
    h) a hydrophobic monomer.

The prepolymer is prepared by reacting one or more polyisocyanates, polyether polyols, modifying agents, capping agents and connecting links.

Element (a), the one or more polyisocyanates, should contain at least two isocyanate groups per molecule and may be linear or branched, aliphatic, cycloaliphatic, or aromatic.

The polyisocyanate preferably contains two isocyanate moieties per molecule. Higher functionality polyisocyanates may be used as a portion of the total isocyanate requirement. However, the use of higher functionality polyisocyanates is limited by the possibility of the formation of a crosslinked, insoluble gel which is unsuitable for purposes of the present invention. Tri- and higher functional polyisocyanates, if used, generally should constitute less than about 20 mole % of the total isocyanate minimum requirement. Preferably, tri- and higher functional polyisocyanates constitute less than about 10 mole % and, most preferably, they are absent from the polyisocyanate.

Exemplary polyisocyanates useful in the preparation of the prepolymer of the present invention are 1,4-tetramethylene diisocyanate, 1,6-hexamethylene diisocyanate, 2,2,4-trimethyl-1,6-diisocyanatohexane, 1,10-decamethylene diisocyanate, 1,4-cyclohexylene diisocyanate, 4,4'-methylenebis-(isocyanatocyclohexane), 1-isocyanato-3-isocyanatomethyl-3,5,5-trimethylcyclohexane, m- and p-phenylene diisocyanate, 2,6- and 2,4-tolylene diisocyanate, xylylene diisocyanate, 4-chloro-1,3-phenylene diisocyanate, 4,4'-biphenylene diisocyanate, 4,4-methylene diphenylisocyanate, 1,5-naphthylene diisocyanate, 1,5-tetrahydronaphthylene diisocyanate, polymethylene polyphenylisocyanates sold under the brand name "PAPI", such as "PAPI 135" (equivalent weight of 133.5 and average isocyanate functionality of 2.7) and "PAPI 901" (equivalent weight of 133 and average isocyanate functionality of 2.3), the aromatic triisocyanate adduct of trimethylol propane and tolylene diisocyanate sold under the brand name "Mondur CB-75", the aliphatic triisocyanate product of the hydrolytic trimerization of 1,6-hexamethylene diisocyanate sold under the brand name "Desmodur N", $C_{36}$ dimer acid diisocyanate sold under then brand name "DDI", based on dimer acids as discussed in J. Am. Oil Chem. Soc. 51, 522 (1974) and mixtures thereof Preferred polyisocyanates include 1,6-hexamethylene diisocyanate, 1-isocyanato-3-isocyanatomethyl-3,5,5-trimethylcyclohexane, the 2,6- and 2,4-tolylene diisocyanates and mixtures thereof. Most preferred are the above referenced two tolylene diisocyanate isomers and mixtures thereof and 1,6-hexamethylene diisocyanate.

It is to be understood that the polyisocyanate molecule may contain functional moieties other than isocyanate if these additional moieties are substantially unreactive with either the isocyanate or the active hydrogen groups under the reaction conditions for the preparation of the prepolymer of this invention. Consistent with this understanding, the term "polyisocyanate" and the named polyisocyanates encompass such materials unless otherwise indicated. Exemplary moieties which do not adversely affect the reaction include ketones, esters, and aldehydes, amides, particularly N,N-disubstituted amides, halogenated hydrocarbons, ethers and tertiary amines.

Element (b), the polyether polyol component used in the present invention may be a homopolymer or a block or random copolymer having the repeating unit:

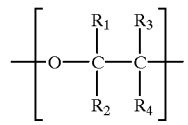

wherein $R_1$, $R_2$, $R_3$ and $R_4$ are independently selected from the group consisting of H, $CH_3$ and $C_2H_5$.

The polyether polyol should have a hydroxyl moiety substantially at each terminus of the polyether chain and/or have one end of the polyether chain linked to a central molecule having at least one additional active hydrogen moiety and/or polyether chain attached thereto. This definition therefore includes low molecular weight polyurethane prepolymers having at least two hydroxyl moieties. In this regard, the polyether polyol may also be a three-dimensional polyether polyol formed by the combination of at least one of the aforementioned homopolymer, block or random copolymers with a material having three or more moieties, onto which the polyether chain may be formed or reacted. Such moieties include amine, carboxylic acid, and hydroxyl functions, and mixtures thereof. Representative examples of these tri- and higher function materials include ethanolamine, glycerol, trimethylol propane, pentaerythritol, sorbitol, malic acid, tartaric acid, and citric acid.

The average molecular weight of the polyether polyol should be from about 200 to about 20,000, preferably from about 2,000 to about 14,000, and most preferably from about 2,000 to about 10,000.

Exemplary preferred polyether polyols useful for the present invention are polyethylene glycol, random and block copolymers of a group of diols consisting of ethylene glycol, copolymers with propylene glycol and/or butylene glycol, and polyether polyol adducts of glycerol, ethylene glycol with glycerol, trimethylol propane, and pentaerythritol and mixtures thereof The most preferred polyether polyol is polyethylene glycol.

Amounts of components a) and b) are selected so that either the isocyanate is in excess or the polyol is in excess, for example from about a 2:1 ratio to about a 1:2 ratio, as known in the art. The excess isocyanate or hydroxyl groups are ultimately capped with elements d) and e) as described hereafter. The number of equivalents of d) and e) are approximately equal to the number of equivalents of the moiety in excess from the reaction of components a) and b) and optional component c).

Element (c), the optional modifying agent or agents, is any molecule which is characterized by the presence of at least one hydrophobic group and at least two moieties reactive with either a) or b). Exemplary active hydrogen moieties are primary amino, secondary amino, hydroxy, carboxy and mercapto.

The optional modifying agent preferably has at least 10 carbon atoms with the hydrophobic group having no moieties reactive with the polyisocyanate or the polyether polyol. Pendant hydrophobic groups are preferred. The pendant hydrophobic group is typically a hydrocarbon group, but it can contain moieties, such as halogen or alkoxy groups, which do not react with the polyisocyanate or polyether polyol and which do not substantially adversely affect the hydrophobic property of the group. The term "pendant" is used to indicate that the hydrophobic group extends in whole or in substantial part from the polymer chain rather than being totally incorporated into the polymer chain.

One form of useful modifying agents can be represented by the following general formula:

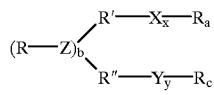

wherein R represents a hydrophobic group containing at least 10 carbon atoms, Z represents a single atom or a small group of atoms with X and Y being attached directly or indirectly to Z via R' and R" and R being attached directly or indirectly via a chain containing 1–8 carbon atoms, X represents hydrogen or a group containing at least one active hydrogen moiety selected from the group consisting of primary amino, secondary amino, hydroxyl, carboxyl, mercapto and mixtures thereof, Y represents a group containing at least one active hydrogen moiety selected from the group consisting of primary amino, secondary amino, carboxyl, hydroxyl, mercapto and mixtures thereof, with the proviso X+Y can be the same or different groups and X and Y are not groups which will react with one another under the reaction conditions for preparing the prepolymer, R' and R" independently represent an alkyl group or groups containing from 0 to 8 carbon atoms, a polyether chain, a polyester chain, a polyamide chain, all having chain molecular weights of less than about 2,000, and mixtures thereof, x and y are at least 1, the sum of (x+y) is at least 2, a, b and c are integers and the sum of (a+b+c) is at least 1.

The pendant hydrophobic group represented by R may be either linear or branched, saturated or unsaturated and aliphatic or aromatic in nature and contains at least 10 carbon atoms preferably from 10 to 22 carbon atoms, more preferably from 10 to 18 carbon atoms and most preferably from 12 to 18 carbon atoms.

Other useful examples of modifying agents include:

A. Amines, such as 1,2-diaminododecane; N-coco-1,3-diaaminopropane; N-cetyl-1,3-diaminopropane; N-(tallow)-1,3-diaminopropane; N-(hydrogenated tallow)-1,3-diaminopropane; N-oleyl-1,3-diaminopropane; and N-soya-1,3-diaminopropane.

B. Acids, such as 1,4-anthracyl dicarboxylic acid; 1,4-phenanthryl dicarboxylic acid; laurylmalonic acid; laurylsuccinic acid; octadecenylsuccinic acid; and oleylsuccinic acid.

C. Alcohols, such as 1,2-dodecanediol; 1,2-tetradecanediol; 1,2-hexadecandiol; 1,2-octadecanediol; 1,2-eicosanediol; or alcohols having the general formula:

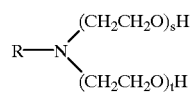

wherein R is the pendant hydrophobic group, s and t are each at least 1 and the sum of (s+t) is from 2 to about 50, preferably from 2 to about 25. Illustrative examples of such diols are available under the name Ethomeen from Akzo Chemie America and include bis[2-hydroxethyl]cocamine; bis[2-hydroxyethyl]tallowamine; bis[2-hydroxyethyl]cetylamine; bis[2-hydroxyethyl](hydrogenated tallow)amine; bis[polyoxyethylene ethanol]tallowamine; and bis[polyoxyethylene ethanol](hydrogenated tallow)amine. More specific examples of this type of modifying agent are polyoxyethylene (5) cocamine; polyoxyethylene (10) cocoamine; polyoxyethylene (15) cocoamine; bis (2-hydroxyethyl) octadecylamine; polyoxyethylene (5) octadecylamine; polyoxyethylene (10) octadecylamine; polyoxyethylene (15) octadecylamine; polyoxyethylene (5) octadecylamine; polyoxyethylene (5) tallowamine; polyoxyethylene (15) tallowamine; polyoxyethylene (50) tallowamine; bis(2-hydroxyethyl) oleylamine; polyoxyethylene (5) oleylamine; polyoxyethylene (15) oleylamine; bis[2-hydroxyethyl] soyaamine; polyoxyethylene (5) soyaamine; polyoxyethylene (10) soyaamine; polyoxyethylene (1 5) soyaamnine, wherein the number in parentheses is the sum of (s+t).

Additional alcohols which may be used as the modifying agent are the N,N-substituted fatty acid amides available under the name Ethomid from Akzo Chemie America and which have the following general formula:

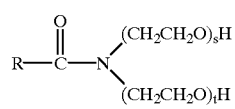

wherein R, s and t have the definitions set forth above.

A further type of alcohol which may be used as a portion of the modifying agent are the reaction products of an N-alkyl trimethylene diamine and an alkylene oxide, such as ethylene oxide, which are available under the name Ethoduomeen from Akzo Chemie America and which have the following general formula:

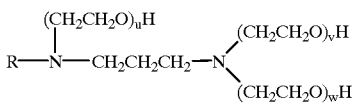

wherein R is the pendant hydrophobic group, at least one of u, v and w is 1 and the sum of (u+v+w) is from 1 to about 50, preferably from 3 to about 10.

D. Amino alcohols, such as 1-amino-2-dodecanol; 1-amino-2-tetradecanol; and 1-amino-2-hexadecanol.

E. Amino acids, having the above defined pendant hydrophobic group.

F. Mercaptans, such as 1, 2-hexadecanedithiol and 1,2-octadecanedithiol.

Additionally useful modifying agents include compounds of the formula:

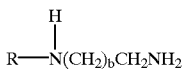

which b can vary between 2 and 15 and where R has the same definition as above.

The prepolymer of this invention may be prepared using more than one modifying agent, either of the same or of a different generic type.

As the name indicates, element (d), the capping agent is used to cap the ends of the prepolymer chain. This prevents further reaction of the chain ends which might cause the polymer to become water insoluble. Additionally, the use of the capping agent reduces the toxicity of the polymer and, most importantly if properly selected, increases the low shear viscosity efficiency.

The amount and type of capping agent is to be determined considering the functional group in excess of components a) and b) and optional component c).

The capping agent is a linear or branched, aliphatic, cycloaliphatic or aromatic compound containing a single functional group that is capable of reacting with the end group of the uncapped prepolymer chain and preferably contains a hydrophobic group.

The capping agent may contain other moieties in addition to that moiety that functions to terminate the prepolymer chain growth. However, these moieties must not be reactive with either isocyanate or active hydrogen components under the reaction conditions used in the preparation of the modified polyurethane of this invention. Such moieties include ketones, aldehydes, esters, hydrogenated hydrocarbons, tertiary amines, ethers and amides, particularly N,N-disubstitued amides.

The capping agent is to be selected to be reactive with either an isocyanate moiety or an active hydrogen compound, and the selection of a particular capping agent is dependent on the reaction conditions and quantities of the other reactants, particularly components a) and b). For example, if the reaction constituents are chosen such that the uncapped modified polyurethane is substantially isocyanate-terminated, the capping agent should contain one active hydrogen moiety capable of reacting with an isocyanate moiety. Such active hydrogen moieties include hydroxyl, carboxyl, mercapto and primary and secondary amino. Representative examples of hydroxyl compounds that may be useful as capping agents include: octanol, decanol, dodecanol (lauryl alcohol), tetradecanol, hexadecanol, stearyl alcohol and 2-ethylhexanol; phenolics, such as phenol and cresol; alkylphenols, such as octylphenol, nonylphenol and dodecylphenol; and alkyl and aryl polyether alcohols, such as the polyethylene oxide adducts of lauryl alcohol, octylphenol and nonyl phenol.

Examples of carboxylic acids that are useful as capping agents include: $C_8$ to $C_{22}$ alkyl carboxylic acids, such as octanoic acid, decanoic acid, dodecanoic acid, tetradecanoic acid, hexadecanoic acid, octadecanoic acid (stearic acid), eicosanoic acid, docosanoic acid; naturally occurring mixtures of acids, such as coco acids, tallow acids, rapeseed acids and the hydrogenated forms of these acids; aromatic acids, such as benzoic acid and naphthenoic acids; alkyl substituted aromatic acids, such as octylbenzoic acid and dodecylbenzoic acid; alicyclic acids, such as cyclopentanecarboxylic acid, cyclohexanecarboxylic acid and cyclooctanecarboxylic acid; and alkoxypropyl acids derived from the addition of alcohols to acrylic acid, such as 3-octyloxypropanoic acid, 3-dodecyloxypropanoic acid and 3-octadecyloxypropanoic acid.

Mercaptans useful as capping agents include octyl mercaptan, decylmercaptan, dodecylmercaptan, tetradecylmercaptan, hexadecylmercaptan, octadecylmercaptan and the like.

Both primary and secondary amines may be used as capping agents in the preparation of the hydrophobically modified polyurethanes of this invention. Particularly useful are those amnines that contain at least one alkyl chain having from 8 to 22 carbon atoms or an aromatic amine. If the amine is a secondary amine (i.e., has two organic radicals attached to a nitrogen), the two radicals may be the same or different. Suitable examples of primary amines useful in this invention are: octylamine, decylamine, dodecylamine, tetradecylamine, hexadecylamine, octadecylamine, eicosylamnine and docosylamine, natural mixtures, such as cocoamine, tallow amine, soya amine, behenylamines; alkoxypropylamines, such as 3-octyloxypropylamine, 3-dodecyloxypropylamine, 3-stearyloxypropyl amine; aromatic amines, such as benzylamine, 1-naphthylamine and 2-naphthylamine. Examples of secondary amines include dioctylamine, didecylamine, didodecylamine, ditetradecylamine, dihexadecylamine, dioctadecylamine, dieicosylamine, didocosylamine, methyloctylamine, methyldodecylamine, methyloctadecylamine, methyloctadecylamine, methylbenzylamine, allylbenzylamine, allyloctadecylamine, benzyloctadecylamine; and natural mixtures, such as dicocoamine, ditallowamine, bis[hydrogenated tallow]amine, disoyaamine and the like. Also useful in the preparation of the modified polyurethane of this invention are the 3,3-dialkylamino-1-propylamine compounds, such as 3,3-dimethylamino-1-propylaimine, 3,3-dioctylamino-1-propylamine, 3,3-ditallowamino-1-propylamine and the like. Tertiary amines, however, are not useful as capping agents in the preparation of the modified polyurethane of this invention unless they contain another active hydrogen moiety, since tertiary amines do not contain an active hydrogen.

Preferred capping agents contain from 8 to 30 carbon atoms and/or an aromatic ring, more preferred are aliphatic compounds containing 10 to 22 carbon atoms, and most preferred are aliphatic compounds containing 12 to 18 carbon atoms. Of the various types of capping agents described, the alcoholic and amino types are most preferred.

Element (e), the connecting link, can be any monomer having a polymerizable double bond and a single active moiety, such as alcohol or amine, as well as mixtures thereof Found particularly useful are hydroxy or amine terminated esters of ethylenically unsaturated carboxylic acid monomers, such as hydroxyethyl acrylate, hydroxypropyl acrylate, hydroxyethyl methacrylate and hydroxypropyl methacrylate and allylic compounds such as allyl alcohols, propoxylated allyl alcohols, ethoxylated allyl alcohols as well as allyl alcohol surfactants, such as allyl alcohol 1,2 butoxylate—block-ethoxylate. Such compounds may include unsaturated aliphatic or aromatic isocyanates, for example, isocyanate ethyl methacrylate, 3-iso propenyl alpha, alpha dimethyl benzyl isocyanate and the like. The amount and type of element e) is to be determined considering the requirement of excess NCO or excess OH based on the amounts of component a) and component b) and optional component c).

The number of equivalents of components d) and e) is preferably approximately equal to the number of equivalents of the moiety in excess of components a), b) and optionally c).

The rheological additive of the present invention is provided by polymerizing the different monomer units described below with the prepolymer described above. Other monomers which do not fall within the following three groups may also be employed in various amounts provided they do not adversely affect the novel characteristics and efficiency of the resultant polymer thickener. Specifically the monomers from which the inventive polymers are prepared in addition to the prepolymer comprise the following:

element f)—one or more $C_3$–$C_8$ α, β-ethylenicafly unsaturated carboxylic acid monomers such as acrylic or methacrylic acid;

element g)—one or more copolymerizable vinylnonionic ethylenically unsaturated monomers such as ethyl acrylate, vinyl acetate or methyl methacrylate; and optionally, element h)—one or more hydrophobic monomers.

Additional monomers, such as polyethylenically unsaturated monomers, commonly known as crosslinking agents, can also be added to the reaction as can macromonomers of the type described in a series of Union Carbide patents of which U.S. Pat. No. 5,342,883 and patents cited therein are representative.

Element f), one or more $C_3$–$C_8$ α, β-ethylenically unsaturated carboxylic acid monomers, include but are not limited to those monomers with the following formula:

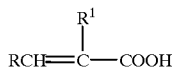

where (a) R is $CH_3$ and $R^1$ is H; (b) R is H and $R^1$ is H, $C_1$–$C_4$ alkyl, or $CH_2COOX$; or (c) R is COOX and $R^1$ is H or $CH_2COOX$; and X is H or $C_1$–$C_4$ alkyl in (b) and (c).

Acrylic or methacrylic acid or mixtures thereof are most preferred, but fumaric, mesaconic, crotonic and ethacrylic acids and esters of these and other polycarboxylic acids such as maleic acid are also suitable, particularly if used in combination with acrylic or methacrylic acids. It is preferable to have about 15 weight percent and most preferably from about 20 to 55 weight percent of the acrylic portion of the copolymer carboxylic acid monomer or monomers. Polycarboxylic acid monomers can be substituted for a portion of the acrylic or methacrylic acid.

Element g), at least one copolymerizable nonionic vinyl $C_2$–$C_{12}$ α, β-ethylenically unsaturated monomer, can be selected from the group consisting of the formula:

where

Y is H and Z is 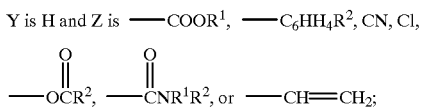

Typical examples of useful monomers are the $C_1$–$C_8$ alkyl and $C_2$–$C_8$ hydroxyalkyl esters of acrylic and methacrylic acid, ethyl acrylate, ethyl methacrylate, methyl methacrylate, 2-ethyehexyl acrylate, butyl acrylate, butyl metbacrylate, 2-hydroxyethyl acrylate, 2-hydroxybutyl methacrylate; the vinyl ester of a saturated aliphatic carboxylic acid such as vinyl acetate, vinyl propionate, vinyl butyrate, or vinyl caprolate; styrene, t-butylstyrene, isopropyistyrene, and p-chlorostyrene; acrylonitrile, methacrylonitrile, butadiene, isoprene, vinyl chloride, vinylidene chloride, or the like, and inxtres thereof. A monomer such as ethyl acrylate or vinyl acetate, or a mixture thereof, along with methyl methacrylate is preferred, The third monomer component, element h), can be any hydrophobic monomer capable of copolymerizing with the other monomers employed.

For example, monomer h) can be of the formula:

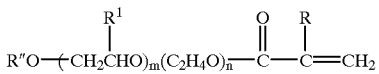

where R is H or $CH_3$; $R^1$ is H or $C_1$–$C_2$ alkyl; R" is any hydrophobic group such as a long chain alkyl, phenol or tristyrylphenol group; n is an average number from about 6–100 and m is an average number from about 0–50 provided that n ≧ m and Σ(n+m) is from about 6–100. Mixture of monomers may be used as (h).

In an associative thickening mechanism, it is generally hypothesized that the hydrophobic moieties of the thickening composition of this invention are absorbed onto the latex particles and/or other ingredients contained in the aqueous system forming a network-like structure. Under the application of shear, the bridged latex particles are mechanically separated causing the desorption of the hydrophobic moieties and a decrease in viscosity known as "shear thinning." Upon the removal of shear force, the recovery is diffusion-controlled resulting in a viscosity increase at a relatively controlled rate resulting in good flow and leveling properties. With the addition of this mechanism to the already effective alkali-swellable mechanism, the polymeric thickeners of the instant invention display increased efficiency in a latex paint system coupled with improved flow and leveling properties.

In a preferred embodiment, the present invention provides a polyurethane-acrylic composition which is the product of the reaction as described above of:

Polyetherpolyol, (Di) Polyisocyanate,

Active hydrogen alcohol(s) and/or an amine(s),

Modifying agent containing a pendant hydrophobic group,

Active hydrogen ethylenically unsaturated monomer as a connecting agent, and

Ethylenically unsaturated monomer(s).

The inventive copolymers in a preferred embodiment are synthesized in two steps: first, a polyurethane copolymer containing components (a) to (e) is synthesized and in a second step, components (f) to (h) are added and polymerized. The connecting link, component (e), is believed to be attached in the final copolymer to its polyurethane copolymer portion through its active hydrogen or amine residue moiety and to its acrylic copolymer portion through its vinyl segment.

In a preferred reaction, hydroxyethyl methacrylate (HEMA) or allyl alcohol 1,2 butoxylate-block-ethoxylate are used as component (e). Any monomer having a polymerizable double bond and an active hydrogen portion such as alcohol or amine can be used instead of HEMA as well as mixtures thereof In a somewhat less preferred embodiment, element e) can include an isocyanate functional monomer which form a connecting link between the polyurethane prepolymer and the acrylic copolymer. Such compounds may include unsaturated aliphatic or aromatic isocyanates, for example, isocyanate ethyl methacrylate, 3-iso propenyl alpha, alpha dimethyl benzyl isocyanate and the like. The reaction employed may be carried out in the bulk or in solvents, in a two step reaction or in a continuous reaction.

The ratio of urethane or acrylic in the copolymer can determine the final nature and qualities of the rheological additive. A family of thickeners may thus be obtained, exhibiting profiles ranging from Newtonian behavior for copolymers containing mostly the urethane portion to highly shear thinning behavior for copolymers containing mostly the alkali swellable portion.

The inventive polymers may be prepared by polymerizing the employed monomers by any method known in the art such as by solution, suspension, or emulsion polymerization on a batch, continuous or semi-continuous basis. Emulsion polymerization is the preferred system since this route leads to an emulsion of the polymer in water which then can be used directly in thickening aqueous compositions, particularly latex paint.

In a typical reaction, components (a) to (e) are prepared in toluene as set forth in the examples. The reaction product is dried and dispersed in water. Components (f) to (h) are added and the monomers are polymerized using standard techniques such as emulsion polymerization. In another procedure, components (a) to (e) may be prepared as is (without toluene) and then dispersed in water and polymerized with the acrylic monomers.

In a further process, components (a) to (e) may be dispersed in the vinyl monomers as defined (one or more), using these monomers as the solvent. Once the first step is completed, water is added and the reaction is continued as above.

Typical aqueous emulsion techniques employ an appropriate emulsifying agent for emulsifying the monomers and for maintaining the thickening polymer obtained in an emulsified condition which is then easy to use.

As an example of a preferred embodiment, emulsion polymerization of the inventive polymer is conducted in the following manner. A reactor is charged with deionized water and heated, usually under a nitrogen blanket. When the temperature reaches about 70–85° C. a mixture of the monomers, a suitable initiator and an emulsifier are added. The emulsifier may be added to the water system or together with the monomers.

The emulsion polymerization initiator used may be one of the free radical yielding initiators such as the inorganic persulfates, percarbonates, perborates, and the like or organic peroxides such as benzoyl peroxide or di-t-butyl peroxide, which are usually employed in free-radical-type polymerization systems. Preferably, ammonium persulfate is employed as the initiator. Mixtures of initiators may also be used as well as those known as redox initiators. The amount of initiator used is normally in the range of from about 0.01 to about 5.0 parts by weight per 100 parts by weight of the total monomeric material reacted.

Any suitable emulsifier known by those skilled in the art may be employed to prepare the polymer, including the anionic, cationic and non-ionic types. Such emulsifiers can dictate the size and form of the resulting polymers. Exemplary anionic emulsifiers which may be employed include alkali metal and ammonium salts of the sulfates of alcohols having from 8 to 18 carbon atoms such as sodium lauryl sulfate.

The reactor having the water, initiator, and emulsifier present therein is typically equipped with any conventional means for agitation. Other ingredients, such as chelating agents, buffering agents, pH adjusting agents, and neutralization chemicals, may also be added.

If desired, conventional chain transfer agents may be used in the polymerization reaction to minimize or prevent undue polymeric chain growth, or to control cross-linking and resultant molecular weight increases. The chain transfer agents are typically first dissolved in the monomers before the monomers are added to the polymerization reactor or emulsified, in the case of the pre-emulsion technique. Suitable chain transfer agents include long chain alkyl mercaptans and carbon tetrachloride. Normally, these agents are used in an amount of from about 0.05 to about 5 parts by weight per 100 parts by weight of the total monomers to be reacted.

The polymeric product of the present invention, whether used as an aqueous polymer emulsion, solid or solution, will thicken aqueous compositions, particularly aqueous coating compositions, and more particularly latex paint compositions upon incorporation of the polymer followed by neutralization into the aqueous composition to be thickened.

The amount of the polymer thickener that may be incorporated in any given aqueous composition depends on the particular system and the viscosity desired. Although any effective amount of the polymer thickener may be employed, typically from about 0.05 to about 20%, preferably from about 0.1 to about 3% by weight, based on the weight of the final aqueous composition including polymer is used.

For latex paint compositions, the polymer may be incorporated therein in an amount of from about 0.05 to about 5%, and preferably from about 0.1 to about 3% by weight, based on the weight of the total latex paint composition including polymer. The mixing of the novel polymeric thickener into a latex paint is particularly easy as the polymer is readily dispersible. In the normal situation, the appropriate amount is mixed into the latex using paint milling apparatus. The novel thickener may be added as a powder, as a pre-made gel in water, in an emulsion or otherwise.

The polymers of the present invention can be employed as thickeners for controlling viscosity and rheology of any aqueous-based composition. An aqueous- based composition is herein defined to be a composition wherein water comprises from 5% to nearly 100% by weight of the total composition. The inventive polymers may be used to impart rheological properties to water solutions such as those used in metal working fluids. Aqueous dispersions, latexes, emulsions, suspensions, solutions, slurries and the like, may be thickened by the subject polymers. Typical aqueous compositions include compositions to be applied to textiles such as latex inks and adhesives, printing inks including high quality inks used in artistic prints, latex sealants and caulks, and flat, semi gloss and high gloss paints.

The polymeric thickeners may also be used when thickening is desired in the purification of water and used in the recovery of oil from exhausted oil wells by water flooding techniques. Other aqueous compositions to which the polymers can be added for thickening purposes include drilling muds, cosmetics, paper coatings, varnishes, stains, furniture finishes, latex paints, foundry core washes, and the like. Aqueous compositions include additional compositions to be applied to textiles such as warp sizing liquids and fluid backings for rugs and similar pile fabrics.

Preferably, the polymers of this invention are used to provide viscosity control to latex paint compositions. Examples of latex paint compositions include those based on resins or binders of acrylonitrile, homopolymers of styrene, copolymers of acrylonitrile, homopolymers and copolymers of vinyl halide resins such as vinyl chloride, or vinyl esters such as vinyl acetate, vinyl acetate homopolymers and copolymers, homopolymers and copolymers of acrylic and methacrylic acid and their esters and derivatives, polybutadiene, butyl rubber, ethylene-propylene copolymers, olefinic resins like polyethylene and polypropylene, polyvinyl alcohol, epoxies, epoxy esters, carboxylated natural and synthetic lattices, polyurethane and similar resin-polymer latex systems.

Such paints and coatings are well known in the art, and typically comprise an emulsion and a dispersion or suspension of discrete disperable particles of resin binder and pigment, including titanium dioxide, and other chemicals in water. Further optional ingredients often include clay, barium sulfate, talc, surfactants, coalescing agents, and the like.

The more usual method of application of the polymers of the present invention for thickening paint is to add the polymer in emulsion to the medium to be thickened and, after mixing, to introduce an alkaline material to neutralize the acidic moieties of the polymer. This method of applying a copolymeric emulsion to an aqueous system before neutralization enables one to handle a high solids thickener in a non-viscous state, to obtain a uniform blend, and then to convert to a highly viscous condition by the simple addition of a base material to bring the pH of the system to pH=7 or above.

The polymer thickeners may optionally be provided in a dry state in a number of ways. For example, the unneutralized copolymer may be spray dried. It is also possible to spray dry or otherwise dehydrate the neutralized polymer thickener, and then reconstitute the aqueous thickener dispersion at a future time and place by agitation in the aqueous medium, provided the pH of the dispersion is maintained at a proper level.

The polymeric compositions described above are easily made, and easily dispersed, rheological additives, equal to or better than comparable higher-cost and more difficult to handle cellulosics, with a wide spectrum of uses.

The thickening composition can be mixed into the aqueous system using conventional mixing equipment such as sand mills, medium and high speed dispersing apparatus, paddle mixers, pebble mills, ball mills, and similar such mixture apparatus. As discussed, the thickening composition of the invention is preferably added to an aqueous system to be thickened thereby in an amount of up to about 3% by weight of said system. The specific amount utilized will depend on a variety of factors within the knowledge of skilled artisans in the particular field wherein the aqueous system is utilized.

The new copolymers were evaluated in a vinyl acrylic semi gloss water based paint formulation and in an acrylic semi gloss paint formulation. The results (see below) show that these copolymers exhibit efficient Stormer viscosity compared to a commercial product used in the field, while imparting good leveling and sag resistance.

The present invention is further illustrated by the following examples. All parts and percentages in the examples as well as in the specification and claims are by weight unless otherwise specified. The following examples are illustrations designed to assist those skilled in the art to practice the present invention, but are not intended to limit the invention. Changes can be made without departing from the spirit of the invention. The various chemicals used in the examples are commercial materials.

EXAMPLES

Example 1

A 500 ml resin flask equipped with a stirrer, thermometer, Dean-Stark trap, condenser, heating mantle and a nitrogen sweep, was charged with 75 grams polyethylene glycol, molecular weight 3400 and 258 grams toluene. The mixture was azeotropically dried at 110° C. to remove water. The mixture was cooled to 75° C. At this temperature were added 0.49 grams hydroxyethyl methacrylate, 0.91 grams hexadecanol, 5.08 grams hexamethylene diisocyanate and a catalyst, dibutyltin dilaurate, 0.13 grams. The mixture was reacted at 75° C for one hour. Kemamine D-970 which is a N-hydrogenated tallow-1,3-propane diamine, 1.33 grams was added and the reaction continued for another hour. The content was removed from the flask and dried.

A 500 ml resin flask equipped with a stirrer, condenser, thermometer, heating mantle and a nitrogen sweep, was charged 125 grams deionized water. The flask was purged with nitrogen for 30 minutes at room temperature. The dried reactive polyurethane of the previous step, weight 25 grams, was added and the mixture was heated to 80° C. under a nitrogen blanket. Ammonium persulfate, 0.05 grams was added and a combined mixture of methacrylic acid, 3.2 grams, methyl methacrylate, 3.2 grams, vinyl acetate, 4.3 grams and a surfactant (Aerosol A-102), 1.04 grams in 25 grams deionized water were added over a period of one hour. After two and a half hours, the temperature was raised to 85° C. and held at that temperature for an additional one hour. The product was removed and dried.

Example 2

A 500 ml resin flask equipped with a stirrer, thermometer, Dean-Stark trap, condenser, heating mantle and a nitrogen sweep, was charged with 69.6 grams polyethylene glycol, molecular weight 3400, 10.4 grams polyethylene glycol, molecular weight 8000 and 279.5 grams toluene. The mixture was azeotrope dried at 110° C. to remove water. The mixture was cooled to 75° C. At this temperature were added 0.45 grams hydroxyethyl methacrylate, 0.82 grams hexadecanol, 4.61 grams hexamethylene diisocyanate and a catalyst, dibutyltin dilaurate, 0.13 grams. The mixture was reacted at 75° C. for one hour. N-hydrogenated tallow-1,3 propane diamine (Kemamine D-970), 1.21 grams was added and the reaction continued for another hour. The content was removed from the flask and dried.

A 500 ml resin flask equipped with a stirrer, condenser, thermometer, heating mantle and a nitrogen sweep, were charged with 150 grams deionized water. The flask was purged with nitrogen for 30 minutes at room temperature. The dried reactive polyurethane of the previous step, weight 18 grams, was added and the mixture was heated to 80° C.

under a nitrogen blanket. Ammonium persulfate, 0.037 grams was added and a combined mixture of methacrylic acid, 2.25 grams, methyl methacrylate, 2.25 grams, vinyl acetate, 3.00 grams and a surfactant (Aerosol A-102), 0.75 grams in 25 grams deionized water were added over a period of one hour. After two and a half hours, the temperature was raised to 85° C. and held at that temperature for an additional one hour. The product was removed and dried.

Example 3

This example is similar to example 2, except that 48.9 grams polyethylene glycol, molecular weight 3400, 26.1 grams polyethylene glycol, molecular weight 8000, 0.33 grams hydroxyethyl methacrylate, 0.63 grams hexadecanol, 3.45 grams hexamethylene diisocyanate and 0.92 grams N-hydrogenated tallow-1,3-propane diamine were added.

Example 4

This example is similar to example 1 except that 80 grams polyethylene glycol, molecular weight 8000, 0.22 grams hydroxyethyl methacrylate, 0.41 grams hexadecanol, 2.3 grams hexamethylene diisocyanate and 0.6 grams N-hydrogenated tallow- 1,3-propane diamine were added.

Example 5

This example is similar to example 1 except that 75 grams polyethylene glycol, molecular weight 3400, 7.14 grams allyl alcohol 1,2 butoxylate block ethoxylate, 0.91 grams hexadecanol, 5.08 grams hexamethylene diisocyanate and 1.33 grams N-hydrogenated tallow-1,3-propane diamine were added.

Example 6

A 500 ml resin flask equipped with a stirrer, thermometer, Dean-Stark trap, condenser, heating mantle and a nitrogen sweep, was charged with 69.6 grams polyethylene glycol, molecular weight 3400, 10.4 grams polyethylene glycol, molecular weight 8000 and 279.5 grams toluene. The mixture was azeotrope dried at 110° C. to remove water. The mixture was cooled to 75° C. At this temperature were added 0.65 grams hydroxyethyl methacrylate, 0.41 grams hexadecanol, 4.48 grams hexamethylene diisocyanate and a catalyst, dibutyltin dilaurate, 0.13 grams. The mixture was reacted at 75° C. for one hour. N-hydrogenated tallow-1,3-propane diamine, 0.64 grams and N-coco 1,3 propane diamine (Duomeen CD), 0.50 grams were added and the reaction continued for another hour. The content was removed from the flask and dried.

A 500 ml resin flask equipped with a stirrer, condenser, thermometer, heating mantle and a nitrogen sweep, is charged 160 grams deionized water. The flask is purged with nitrogen for 30 minutes at room temperature. The dried reactive polyurethane of the previous step, 24.5 grams, is added and the mixture is heated to 80° C. under a nitrogen blanket. Ammonium persulfate, 0.05 grams is added and a combined mixture of methacrylic acid, 2.25 grams, methyl methacrylate, 2.25 grams, vinyl acetate, 3.0 grams and a surfactant (Aerosol A-102), 0.75 grams in 25 grams deionized water were added over a period of one hour. After two and a half hours, the temperature is raised to 85° C. and held at that temperature for an additional one hour. The product is removed and dried.

Example 7

This example is similar to example 6 except that 48.9 grams polyethylene glycol, molecular weight 3400, 26.1 grams polyethylene glycol, molecular weight 8000, 0.49 grams hydroxyethyl methacrylate, 0.29 grams hexadecanol, 3.36 grams hexamethylene diisocyanate, 0.48 grams N-hydrogenated tallow-1,3-propane diamine and 0.39 grams N-coco-1,3-propanediamine were added. 12.25 grams of the urethane prepolymer were used to which 2.25 grams methacrylic acid, 2.25 grams methyl methacrylate, 3.0 grams vinyl acetate, 0.04 ammonium persulfate and 0.75 grams surfactant (Aerosol A- 102) in 25 grams deionized water were added.

Example 8

This example is similar to Example 1, except that a fourth monomer, a hydrophobically modified ester of methacrylic acid, Sipomer SEM-25, 0.86 grams is added with the ethylenically unsaturated monomers. The reaction conditions and the amounts of the other components are the same as in Example 1 except that 0.05 grams ammonium persulfate, and 1.1 grams of the surfactant (Aerosol A-102) are added.

Example 9

This example is similar to Example 3, except that a fourth monomer, a hydrophobically modified ester of methacrylic acid, Sipomer SEM-25, 0.6 grams is added with the ethylenically unsaturated monomers. The reaction conditions and the amounts of the other components are the same as in Example 3 except that 0.04 grams ammonium persulfate, and 0.75 grams of the surfactant (Aerosol A-1 02) are added.

Example 10

This example is similar to Example 5, except that a fourth monomer, a hydrophobically modified ester of methacrylic acid, Sipomer SEM-25, 0.86 grams is added with the ethylenically unsaturated monomers. The reaction conditions and the amounts of the other components are the same as in Example 5, except that 0.05 grams ammonium persulfate, and 1.1 grams of the surfactant (Aerosol A-102) are added.

Example 11

This example is similar to Example 7, except that a fourth monomer, a hydrophobically modified ester of methacrylic acid, Sipomer SEM-25, 0.84 grams is added with the ethylenically unsaturated monomers. The reaction conditions and the amounts of the other components are the same as in Example 7, except that 0.06 grams ammonium persulfate, and 1.1 grams of the surfactant (Aerosol A-1 02) are added to 24.5 grams of the urethane prepolymer.

Example 12

This Example is similar to Example 1 except that the ethylenically unsaturated monomers are used as the solvent. This method allows the continuous synthesis and does not require the removal of toluene and drying before proceeding to the polymerization of the acrylic components. Thus, a combined mixture of methacrylic acid, 10.6 grams, methyl methacrylate, 10.6 grams and vinyl acetate, 14.2 grams was charged to a 500 ml resin flask equipped with a stirrer, condenser, thermometer, heating mantle and a nitrogen sweep. 75 grams polyethylene glycol, molecular weight 3400 was added to the mixture. 0.49 grams hydroxyethyl methacrylate, 0.91 grams hexadecanol, 5.08 grams hexamethylene diisocyanate and a catalyst, dibutyltin dilaurate, 0.13 grams were then added. The mixture was reacted at 75° C. for one hour. N-hydrogenated tallow-1,3-propane diamine, 1.33 grams was then added and the reaction continued for another hour. 500 ml deionized water were then added together with ammonium persulfate, 0.17 grams and the surfactant (Aerosol A-102), 3.55 grams. The reaction proceeded for three hours at 75° C. The temperature was raised to 80° C. and held at that temperature for an additional one hour. The reaction product was cooled to room temperature and remained as a thick emulsion without drying.

Example 13

This Example is similar to Example 7 except that the ethylenically unsaturated monomers were used as the solvent. This method allows the continuous synthesis and does not require the removal of toluene and drying before proceeding to the polymerization of the acrylic components. Thus, a combined mixture of methacrylic acid, 19.2 grams, methyl methacrylate, 19.2 grams and vinyl acetate, 25.5 grams was charged to a 500 ml resin flask equipped with a stirrer, condenser, thermometer, heating mantle and a nitrogen sweep. 98.0 grams polyethylene glycol, molecular weight 3400, 52.0 grams polyethylene glycol, molecular weight 8000 were added to the mixture. 1.02 grams hydroxyethyl methacrylate, 0.59 grams hexadecanol, 6.93 grams hexamethylene diisocyanate and a catalyst, dibutyltin dilaurate, 0.13 grams were then added. The mixture was reacted at 75° C. for one hour. N-hydrogenated tallow-1,3-propane diamine, 0.99 grams and N-coco-1,3-propanediamine (Duomeen CD), 0.77 grams were added and the reaction continued for another hour. 500 ml deionized water were then added together with ammonium persulfate, 0.31 grams and the surfactant (Aerosol A-102), 6.4 grams. The reaction proceeded for three hours at 75° C. The temperature was raised to 80° C. and held at that temperature for an additional one hour. The reaction product was cooled to room temperature and remains as a thick emulsion without drying.

Example 14

This example is similar to Example 9, except that a fourth monomer, a hydrophobically modified ester of methacrylic acid, Sipomer SEM-25, 5.52 grams was added to the water portion. The reaction conditions and the amounts of the other components were the same as in Example 9, except that 0.35 grams ammonium persulfate, and 7.13 grams of the surfactant (Aerosol A-102) were added.

Example 15

This example is similar to Example 11, except that a fourth monomer, a hydrophobically modified ester of methacrylic acid, Sipomer SEM-25, 5.10 grams was added to the water portion. The reaction conditions and the amounts of the other components were the same as in Example 11, except that 0.32 grams ammonium persulfate, and 6.8 grams of the surfactant (Aerosol A-102) were added.

Example 16

This example is similar to example 3 except that the two steps were carried out separately and the components are mixed to a blend

Example 17

This example is similar to example 7 except that the two steps were carried out separately and the components are mixed to a blend

Example 18

This example is similar to example 9 except that the two steps were carried out separately and the components are mixed to a blend

Example 19

This example is similar to example 11 except that the two steps were carried out separately and the components are mixed to a blend

Comparative Example A

This example is similar to the first stage of Example 1 without the addition of hydroxyethyl methacrylate. This product is commercially available from RHEOX as RHEOLATE 205.

Comparative Example B

This example is similar to the first stage of Example 6 without the addition of hydroxyethyl methacrylate. This product is commercially available from RHEOX as RHEOLATE 208.

Comparative Example C

This example is similar to the second stage of Example 1 without the addition of hydroxyethyl methacrylate. This product is commercially available from RHEOX as RHEOLATE 101.

Comparative Example D

This example is similar to the first stage of Example 8 without the addition of hydroxyethyl methacrylate. This product is commercially available from RHEOX as RHEOLATE 420.

Comparative Example E

This example is a commercial acrylic monoisocyanate available from Union Carbide as Polyphobe 111

Comparative Example F

This example is a commercial acrylic monoisocyanate available from Union Carbide as Polyphobe 102.

Comparative Example G

Hydrophobically modified hydroxyethyl cellulose. This product is commercially available from Aqualon as Natrosol Plus.

EXAMPLES 20–47

A typical vinyl acrylic semi gloss paint was prepared according to Formulation 1.

| Formulation 1 | | |
|---|---|---|
| Material | Commercial Name | Weight (Pounds) |
| Water | | 150.00 |
| Preservative | Nuosept C | 2.40 |
| Dispersant | Tamol 983 | 5.00 |
| Surfactant | Triton N-57 | 2.10 |
| Base | AMP-95 | 1.00 |
| Propylene glycol | | 43.20 |
| Defoamer | Colloid 643 | 1.00 |
| Calcium carbonate | Omya Carb UF | 45.00 |
| Titanium dioxide | KRONOS 2310 | 200.00 |
| Mix at high speed | | |
| Vinyl acrylic latex | UCAR 379 | 428.40 |
| Coalescing solvent | Texanol | 20.00 |

-continued

Formulation 1

| Material | Commercial Name | Weight (Pounds) |
|---|---|---|
| Defoamer | Colloid 643 | 2.00 |
| Surfactant | Triton GR-7M | 0.50 |
| Water + Rheological Additives | | 148.10 |
| Total | | 1048.70 |

Examples 1–19 were incorporated in formulation 1 and compared to the comparative examples. Examples 20 to 47 are the paint products prepared with the previous examples. Paint properties are shown in Table 1. Paint properties were determined according to the following ASTM tests:

Stormer viscosity: ASTM D-562
Leveling: ASTM D-4062
Sag resistance: ASTM D-4400
ICI viscosity: ASTM D-4287
Gloss: ASTM D-4540

TABLE 1

| Example | Amount Lbs/100 Gal | Stormer KU | ICI Poise | Leveling | Sag Mil | Gloss 60° |
|---|---|---|---|---|---|---|
| 20 (1) | 7.5 | 96 | 0.5 | 5 | 12 | 29 |
| 21 (2) | 7.0 | 100 | 1.4 | 1 | 20 | 22 |
| 22 (3) | 6.3 | 94 | 0.6 | 4 | 18 | 53 |
| 23 (4) | 5.0 | 96 | 1.4 | 1 | 18 | 49 |
| 24 (5) | 6.3 | 102 | 0.6 | 5 | 10 | 49 |
| 25 (6) | 5.0 | 65 | 0.8 | 8 | 7 | 17 |
| 26 (6) | 7.5 | 68 | 0.7 | — | 8 | 37 |
| 27 (7) | 7.5 | 83 | 0.4 | 5 | 25 | 21 |
| 28 (8) | 7.5 | 106 | 0.7 | 4 | 14 | 24 |
| 29 (9) | 6.3 | 106 | 0.4 | 2 | 20 | 55 |
| 30 (10) | 5.0 | 102 | 0.6 | 4 | 10 | 50 |
| 31 (11) | 7.0 | 96 | 0.3 | 2 | 20 | 34 |
| 32 (12) | 10.0 | 65 | 0.2 | 4 | 11 | 45 |
| 33 (13) | 7.0 | 62 | 0.2 | 8 | 9 | 44 |
| 34 (13) | 10.0 | 65 | 0.3 | 5 | 16 | 46 |
| 35 (14) | 10.0 | 91 | 0.6 | 5 | 12 | 48 |
| 36 (15) | 7.0 | 64 | 0.2 | 9 | 9 | 44 |
| 37 (15) | 10.0 | 82 | 0.4 | 5 | 20 | 42 |
| 38 (16) | 6.5 | 97 | 0.4 | 6 | 14 | 53 |
| 39 (17) | 6.5 | 90 | 0.8 | 3 | 14 | 55 |
| 40 (18) | 6.0 | 91 | 0.6 | 4 | 14 | 57 |
| 41 (19) | 6.0 | 89 | 1.0 | 4 | 12 | 58 |
| 42 (Comp A) | 7.0 | 90 | 0.8 | 9 | 10 | 61 |
| 43 (Comp B) | 7.0 | 83 | 1.5 | 9 | 8 | 60 |
| 44 (Comp C) | 6.6 | 88 | 1.4 | 1 | 18 | 53 |
| 45 (Comp D) | 4.0 | 93 | 0.5 | 2 | 25 | 44 |
| 46 (Comp E) | 10.0 | 93 | 1.1 | 4 | 12 | 45 |
| 47 (Comp G) | 6.0 | 97 | 0.3 | 3 | 5 | 42 |

EXAMPLES 48–74

A typical acrylic semi gloss paint is prepared according to Formulation 2.

Formulation 2

| Material | Commercial Name | Weight (Pounds) |
|---|---|---|
| Water | | 25.00 |
| Dispersant | Tamol SG-1 | 10.00 |
| Propylene glycol | | 56.10 |
| Titanium dioxide | DuPont R-900 | 255.00 |

-continued

Formulation 2

| Material | Commercial Name | Weight (Pounds) |
|---|---|---|
| Mix at high speed | | |
| Acrylic latex | UCAR 417 | 535.00 |
| Defoamer | Colloid 643 | 4.50 |
| Coalescing solvent | Texanol | 20.00 |
| Surfactant | Triton GR-7M | 0.50 |
| Propylene glycol | | 11.00 |
| Water + Rheological Additives | | 94.10 |
| Total | | 1067.80 |

Examples 1–19 were incorporated in formulation 2 and compared to the comparative examples. Paint properties are shown in Table 2.

TABLE 2

| Example | Amount Lbs/100 Gal | Stormer KU | ICI Poise | Leveling | Sag Mil | Gloss 60° |
|---|---|---|---|---|---|---|
| 48 (1) | 2.0 | 90 | 0.8 | 6 | 18 | 67 |
| 49 (2) | 2.0 | 93 | 1.0 | 5 | 20 | 51 |
| 50 (3) | 2.0 | 105 | 0.5 | 3 | 30 | 74 |
| 51 (4) | 2.0 | 100 | 0.9 | 5 | 20 | 52 |
| 52 (5) | 2.0 | 103 | 0.7 | 2 | 20 | 76 |
| 53 (6) | 3.0 | 86 | 1.5 | 5 | 14 | 61 |
| 54 (7) | 2.0 | 94 | 0.6 | 2 | 25 | 60 |
| 55 (8) | 2.0 | 92 | 0.9 | 7 | 20 | 65 |
| 56 (9) | 2.0 | 108 | 0.4 | 1 | 35 | 75 |
| 57 (10) | 1.5 | 96 | 0.7 | 3 | 20 | 77 |
| 58 (11) | 2.0 | 101 | 0.6 | 2 | 40 | 63 |
| 59 (12) | 2.0 | 85 | 0.5 | 5 | 14 | 67 |
| 60 (13*) | 4.0 | 98 | 0.7 | 2 | 25 | 69 |
| 61 (13) | 3.0 | 86 | 0.8 | 4 | 14 | 67 |
| 62 (14*) | 4.0 | 97 | 0.7 | 1 | 30 | 71 |
| 63 (14) | 3.0 | 102 | 1.0 | 3 | 30 | 62 |
| 64 (15) | 3.0 | 93 | 0.9 | 5 | 20 | 71 |
| 65 (16) | 2.0 | 94 | 0.5 | 2 | 18 | 75 |
| 66 (17) | 2.0 | 101 | 0.6 | 1 | 20 | 74 |
| 67 (18) | 2.0 | 106 | 0.6 | 1 | 30 | 73 |
| 68 (19) | 2.0 | 108 | 0.5 | 1 | 25 | 73 |
| 69 (Comp A) | 2.0 | 96 | 0.5 | 4 | 16 | 76 |
| 70 (Comp B) | 2.0 | 99 | 0.6 | 3 | 18 | 80 |
| 71 (Comp C) | 2.0 | 89 | 1.1 | 5 | 25 | 66 |
| 72 (Comp D) | 1.5 | 110 | 0.6 | 1 | 35 | 73 |
| 73 (Comp F) | 2.0 | 96 | 0.8 | 2 | 16 | 75 |
| 74 (Comp G) | 3.0 | 89 | 0.8 | 3 | 14 | 47 |

*-polyethylene glycol molecular weight 3400

We claim:

1. A urethane-acrylic thickening composition for aqueous systems produced as a reaction product synthesized in two steps:
   i) first by producing a prepolymer comprised of the reaction product of:
      a) one or more polyisocyanates having at least two isocyanate groups per molecule;
      b) one or more polyether polyols having the repeat unit

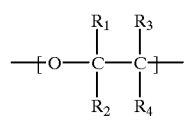

where $R_1$, $R_2$, $R_3$, and $R_4$ are independently selected from the group consisting of H, $CH_3$ and $C_2H_5$, including polyether polyol polymers and copolymers of ethylene glycol, propylene glycol or butylene glycol, and mixtures thereof;

c) a capping agent comprising one or more linear or branched aliphatic, cycloaliphatic or aromatic compounds containing a single active functional group selected to be reactive with an isocyanate or active hydrogen end group, d) a connecting link, which also acts as a capping agent, having a polymerizable double bond and a single active moiety having the structure

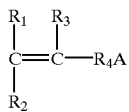

where $R_1$, $R_2$ and $R_3$ are independently selected from the group consisting of hydrogen, a linear or branched, aliphatic or aromatic chain containing from 1 to 30 carbon atoms, and carboxylic acid —COOX where X is hydrogen or an alkali, ammonium or amino group or a linear or branched, aliphatic or aromatic chain containing from 1 to 30 carbon atoms and $R_4$ is selected from the group consisting of linear or branched, aliphatic or aromatic chains containing from 1 to 30 carbon atoms, a repeat unit as defined in b) and copolymers thereof, and A is hydroxyl, a primary or secondary amino group, allyl alcohol, ethoxylated allyl alcohol, propoxylated allyl alcohol, allyl alcohol surfactants, and mixtures thereof, and;

ii) when the prepolymer is formed, reacting the prepolymer with the following components:

e) one or more $C_3$–$C_8$ a, b-ethylenically unsaturated carboxylic acid monomers; and f) one or more copolymerizable nonionic vinyl monomers, thereby producing said urethane-acrylic thickening composition.

2. The composition of claim 1 wherein reactants a) and b) are in a ratio range of one to the other from about 2:1 to about 1:2.

3. The composition of claim 1 wherein reactants d) and e) are about equal to the number of equivalents of the moiety in excess of reactants a) and b).

4. The composition of claim 1 wherein e) is selected from the group consisting of hydroxy ethylacrylate, hydroxypropyl acrylate, hydroxethyl methacrylate, hydroxypropyl methacrylate, allyl alcohol, propoxylated allyl alcohol, allyl alcohol 1,2 butoxylate bloc ethoxylate and mixtures thereof.

5. The composition of claim 1, wherein A in paragraph d) is hydroxyethyl acrylate, hydroxypropyl acrylate, hydroxyethyl methacrylate, or hydroxypropyl methacrylate.

* * * * *

UNITED STATES PATENT AND TRADEMARK OFFICE
CERTIFICATE OF CORRECTION

PATENT NO.   : 6,069,217
DATED        : May 30, 2000
INVENTOR(S)  : Nae et al.

It is certified that error appears in the above-identified patent and that said Letters Patent is hereby corrected as shown below:

<u>Column 24,</u>
Line 18, the "e)" is changed to -- d) --.

Signed and Sealed this

Sixteenth Day of April, 2002

Attest:

JAMES E. ROGAN
*Attesting Officer*  *Director of the United States Patent and Trademark Office*